(12) United States Patent
Kondoh

(10) Patent No.: US 9,006,760 B2
(45) Date of Patent: Apr. 14, 2015

(54) DISPLAY PANEL AND DISPLAY DEVICE

(71) Applicant: Panasonic Corporation, Osaka (JP)

(72) Inventor: Tetsuro Kondoh, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/364,688

(22) PCT Filed: Dec. 7, 2012

(86) PCT No.: PCT/JP2012/007842
§ 371 (c)(1),
(2) Date: Jun. 12, 2014

(87) PCT Pub. No.: WO2013/094142
PCT Pub. Date: Jun. 27, 2013

(65) Prior Publication Data
US 2014/0319556 A1 Oct. 30, 2014

(30) Foreign Application Priority Data
Dec. 21, 2011 (JP) .................................. 2011-280285

(51) Int. Cl.
*H01L 27/32* (2006.01)
*H01L 51/52* (2006.01)

(52) U.S. Cl.
CPC ........ *H01L 27/3276* (2013.01); *H01L 27/3211* (2013.01); *H01L 27/3246* (2013.01); *H01L 51/525* (2013.01)

(58) Field of Classification Search
USPC .......................................................... 257/72
See application file for complete search history.

(56) References Cited

U.S. PATENT DOCUMENTS

| 5,443,922 A | 8/1995 | Nishizaki et al. |
| 6,900,470 B2 | 5/2005 | Kobayashi et al. |
| 7,491,975 B2 | 2/2009 | Kubota |
| 7,605,535 B2 * | 10/2009 | Kobayashi .................... 313/506 |
| 2002/0158835 A1 | 10/2002 | Kobayashi et al. |
| 2007/0126683 A1 * | 6/2007 | Sung et al. ....................... 345/92 |

(Continued)

FOREIGN PATENT DOCUMENTS

| JP | 05-163488 | 6/1993 |
| JP | 2002-318556 | 10/2002 |

(Continued)

OTHER PUBLICATIONS

International Search Report (ISR) in International Patent Application No. PCT/JP2012/007842, dated Feb. 12, 2013.

*Primary Examiner* — Thao P Le
(74) *Attorney, Agent, or Firm* — Greenblum & Bernstein, P.L.C.

(57) ABSTRACT

A display panel includes: a substrate on which a plurality of feed terminals corresponding to a plurality of pixels are provided; a plurality of pixel electrodes corresponding to the respective pixels; a common electrode common to the pixels; and a plurality of light-emitting layers corresponding to the respective pixels and provided between the pixel electrodes and the common electrode. In plan view, within each of the pixels, the light-emitting layer and the feed terminal do not overlap, feed terminals of each column of pixels are provided in a column, and the common electrode is electrically connected to conductive layers, the conductive layers each having a shape of a line that overlaps a corresponding one of the columns of feed terminals. Accordingly, the display panel achieves a high aperture ratio even with the conductive layers formed therein.

11 Claims, 12 Drawing Sheets

(56) References Cited

U.S. PATENT DOCUMENTS

| | | | |
|---|---|---|---|
| 2007/0242176 A1* | 10/2007 | Chang et al. | 349/42 |
| 2007/0273305 A1* | 11/2007 | Kubota | 315/312 |
| 2014/0139772 A1* | 5/2014 | Kim et al. | 349/43 |
| 2014/0152171 A1* | 6/2014 | Kondoh, Tetsuro | 313/498 |

FOREIGN PATENT DOCUMENTS

| | | |
|---|---|---|
| JP | 2007-156388 | 6/2007 |
| JP | 2007-227129 | 9/2007 |
| JP | 2007-265756 | 10/2007 |
| JP | 2011-154968 | 8/2011 |

\* cited by examiner

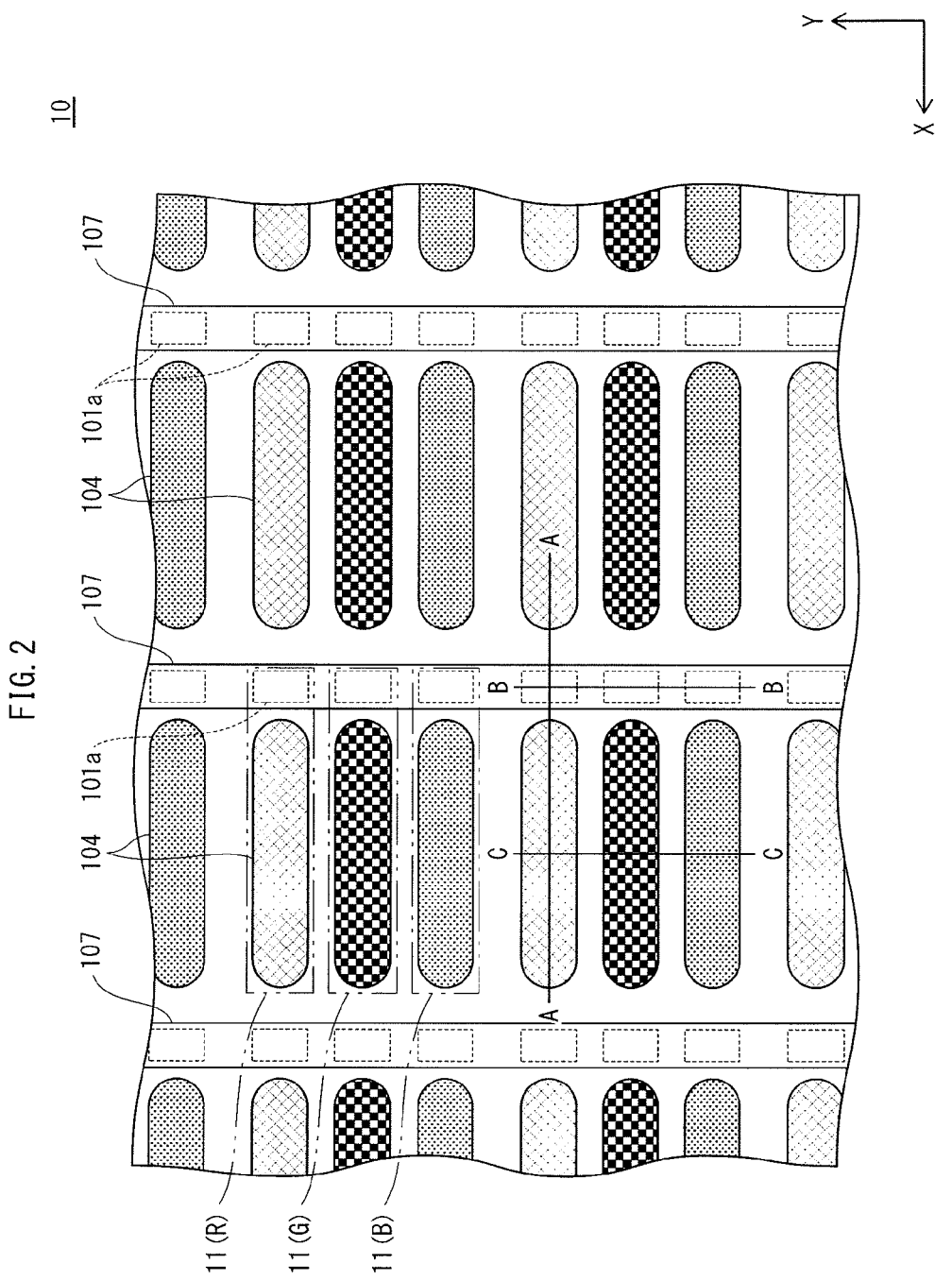

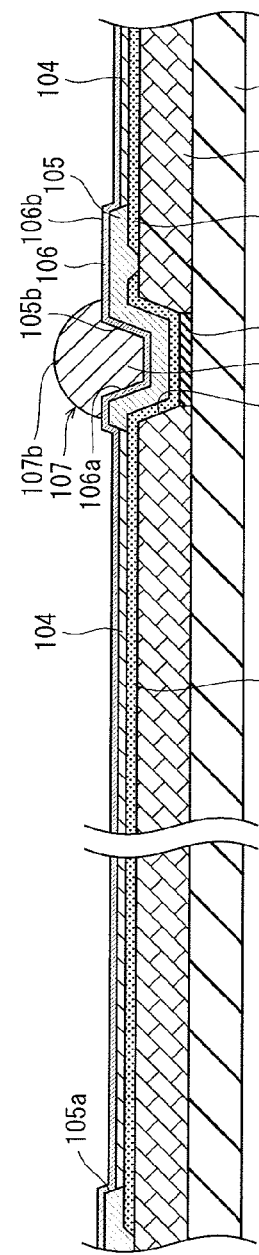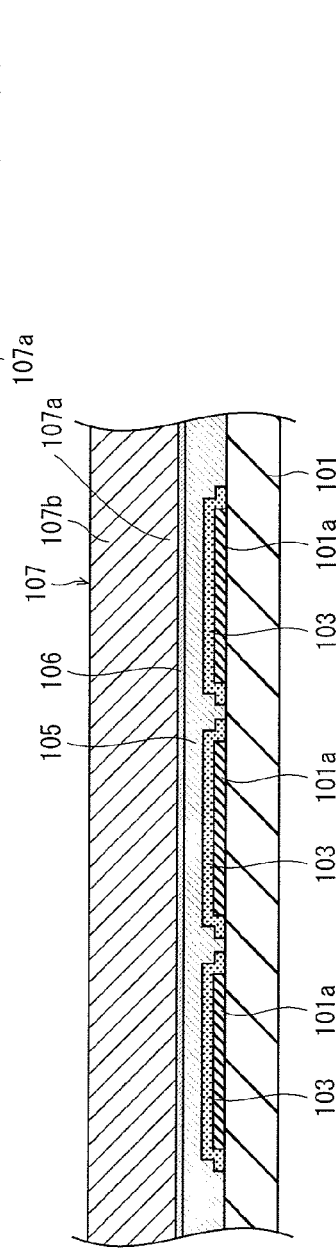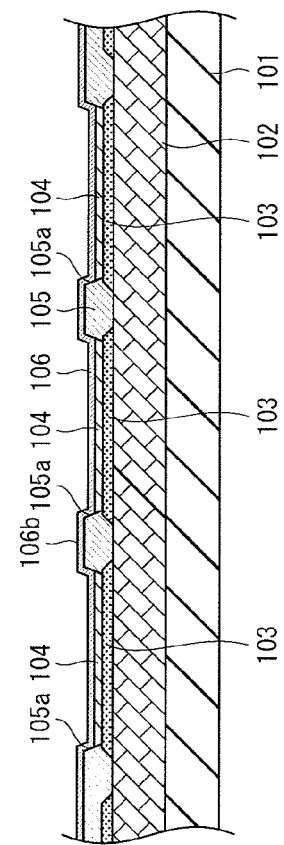

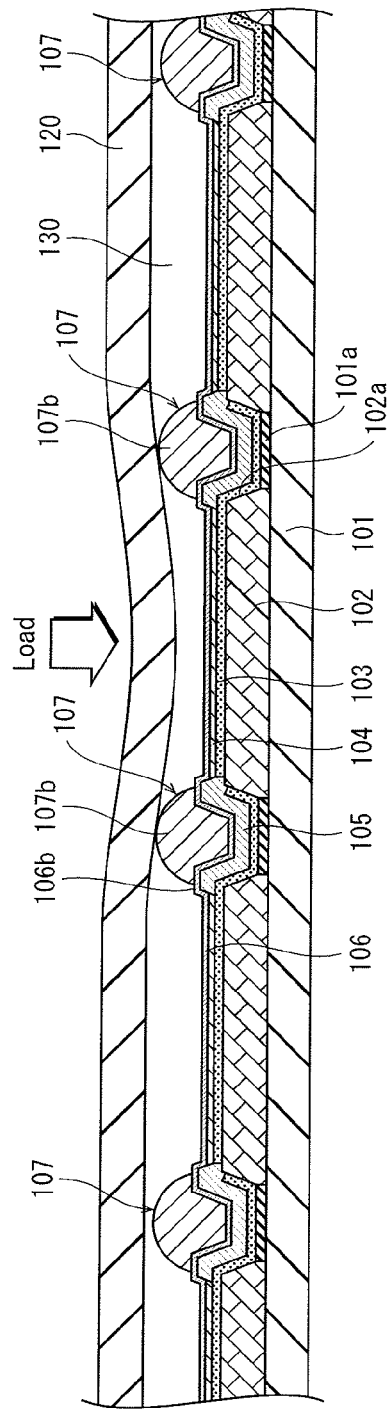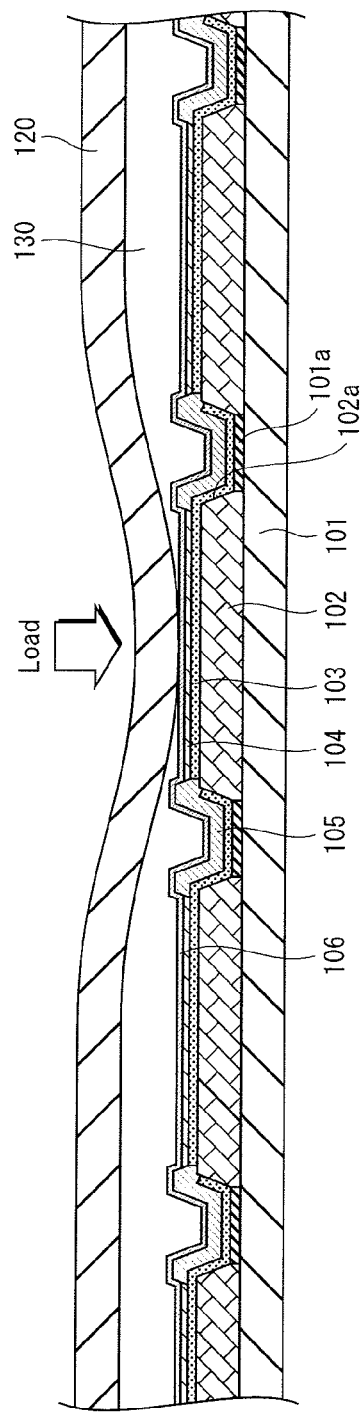

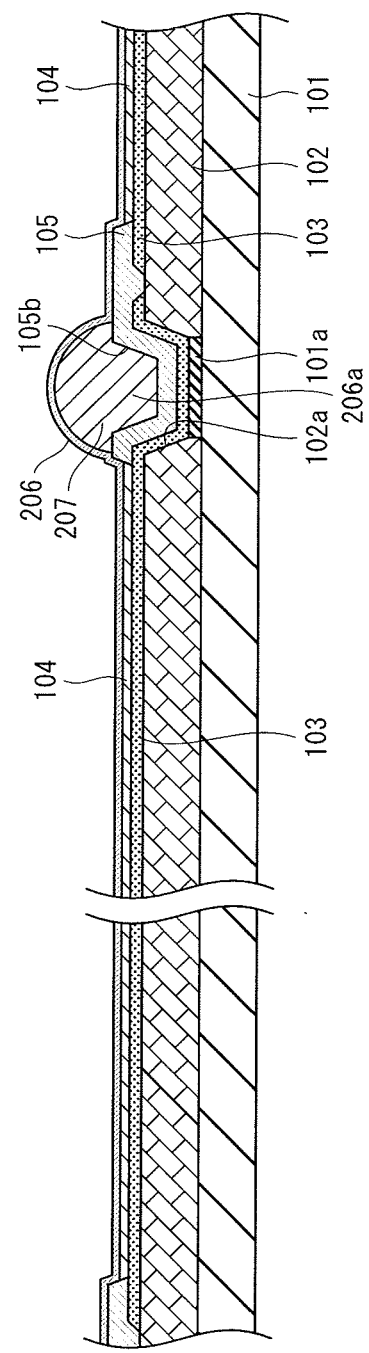
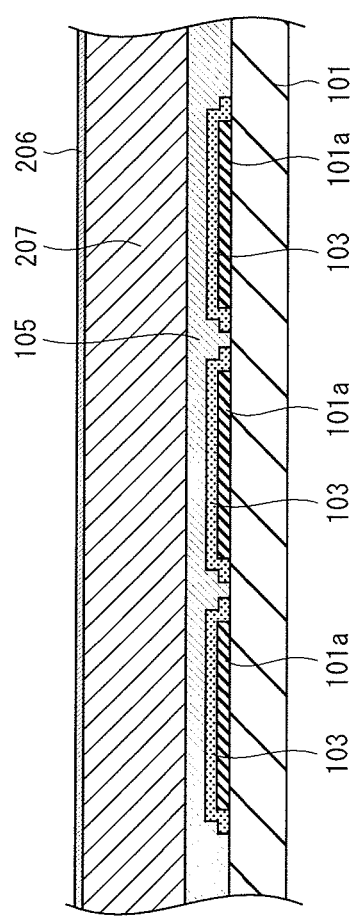
FIG. 6A
FIG. 6B

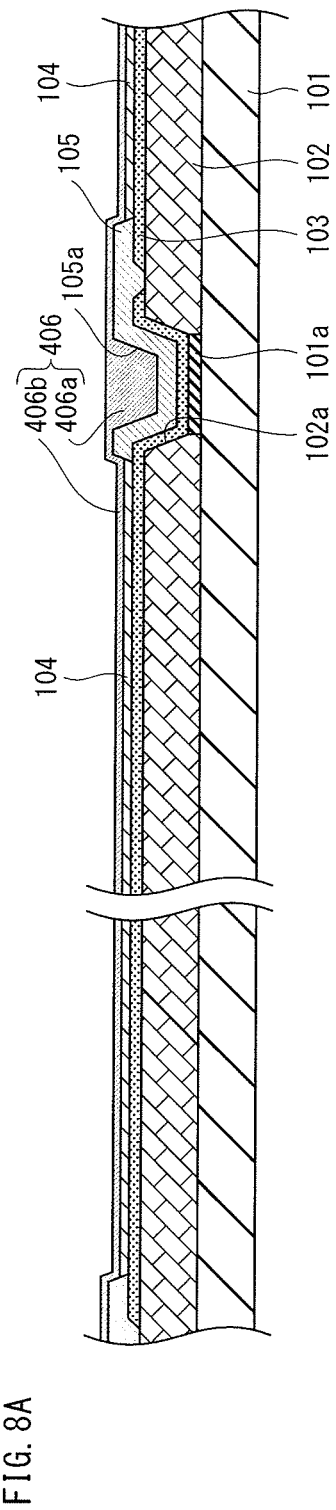
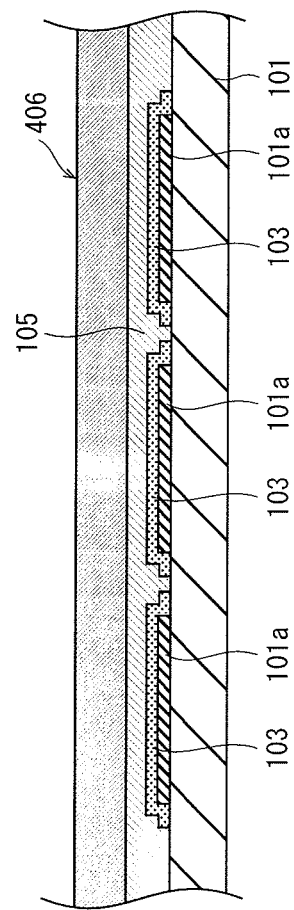
FIG. 8A
FIG. 8B

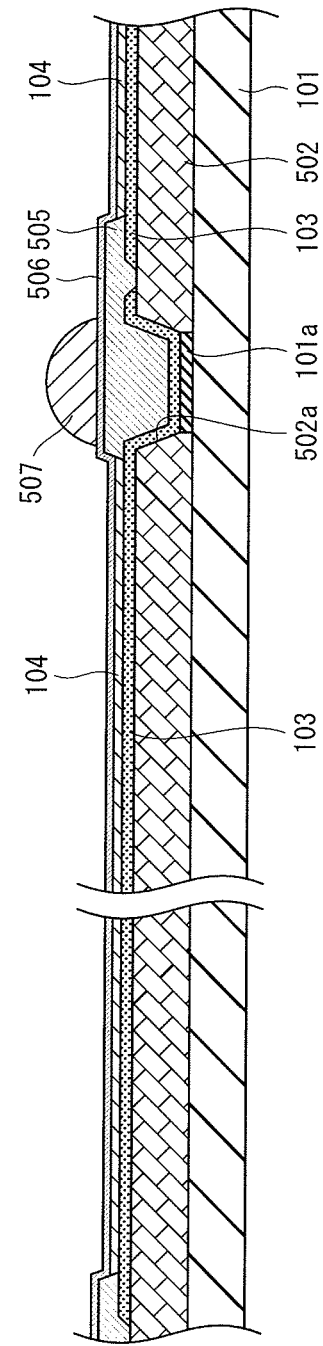
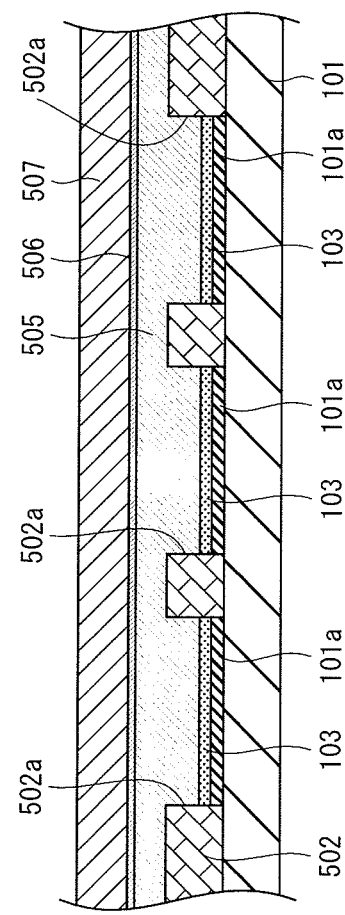
FIG. 9A
FIG. 9B

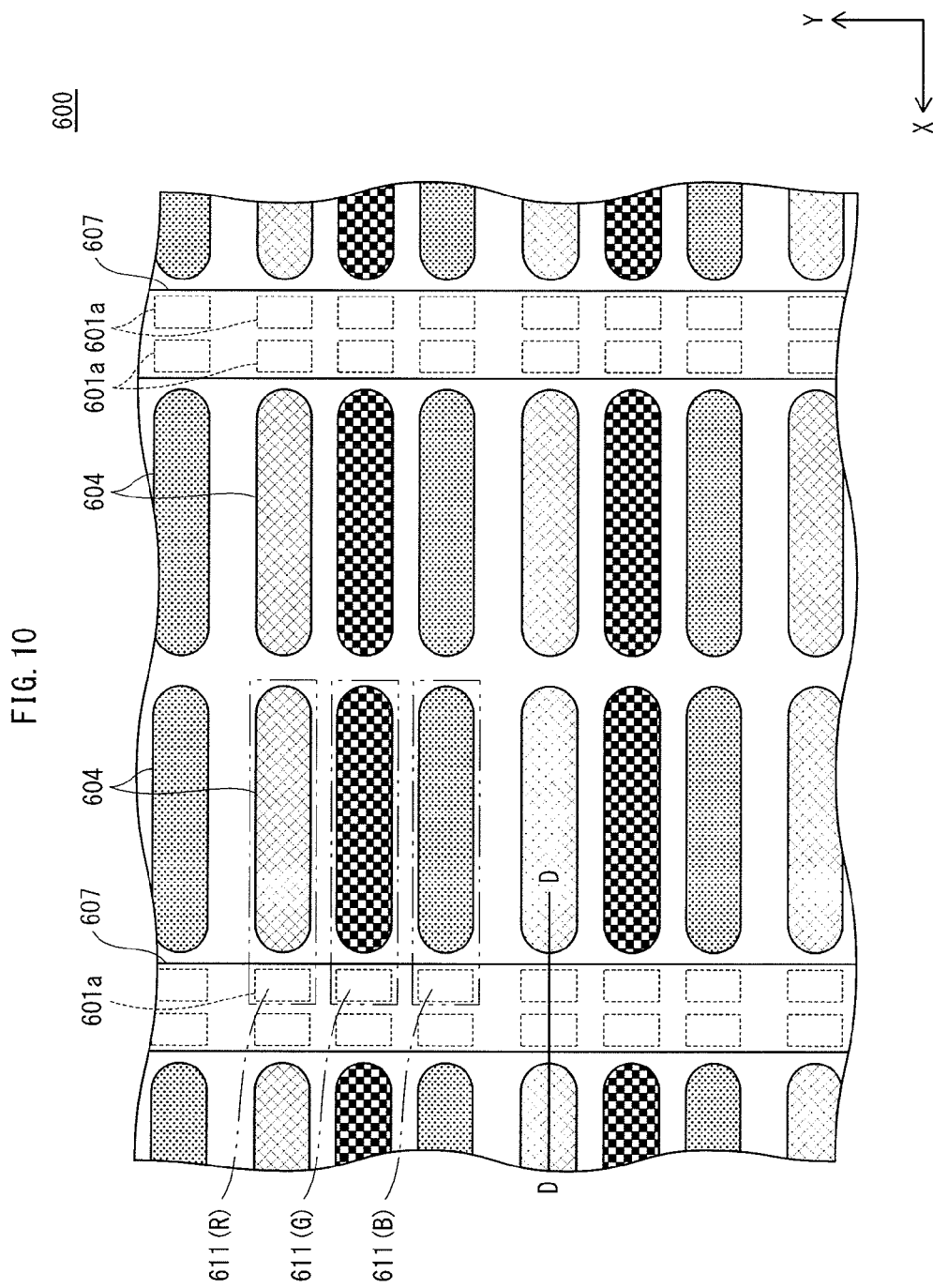

DISPLAY PANEL AND DISPLAY DEVICE

TECHNICAL FIELD

The present invention relates to a display panel, and a display device including the display panel. In particular, the present invention relates to a technology for improving the aperture ratio of an EL display panel.

BACKGROUND ART

One example of an EL display panel is an organic EL display panel that uses the phenomenon of electroluminescence occurring in an organic material. In a top-emission type organic EL display panel, a plurality of pixels that each include a pixel electrode, an organic light-emitting layer, and a common electrode are arranged in a matrix, for example. In such an organic EL display panel, in order to prevent a voltage drop that occurs in a common electrode with increasing size of a screen of the panel, a conductive layer (so-called busbar) electrically connected to the common electrode is formed in a region that does not overlap the pixels. For example, as shown in FIG. 12, a conductive layer 902 is formed to have the shape of a line extending row-wise (in the X-axis direction). Specifically, the conductive layer 902 is formed row-wise between lines that are each made up of a plurality of pixels 901 arranged row-wise (in the X-axis direction).

CITATION LIST

Patent Literature

[Patent Literature 1]
Japanese Patent Application Publication No. 2002-318556

SUMMARY OF INVENTION

Technical Problem

In recent years, there has been a growing demand for improvement of the aperture ratio of a display panel. The aperture ratio is obtained by calculating the proportion of a light-emitting region to the entirety of a display screen of the display panel. The light-emitting region corresponds to a region in which light-emitting layers 903 of the pixels 901 are formed. On the other hand, a non-light-emitting region refers to a region from which light is not emitted. The non-light-emitting region corresponds to a region in which contact windows 904 of the pixels 901 are formed, and to a region that is outside the pixels 901 and in which the conductive layers 902 are formed. An increase in the area of the non-light-emitting region causes a decrease in the aperture ratio due to a correlation between the non-light-emitting region and the light-emitting region. In other words, formation of the conductive layers 902 is a hindrance to the improvement of the aperture ratio.

An object of the present invention is to provide a display panel and a display device that each achieve a high aperture ratio even with a conductive layer formed therein.

Solution to Problem

In order to achieve the above object, one aspect of the present invention is a display panel having a plurality of pixels arranged in rows and columns, the display panel comprising: a substrate on which a plurality of feed terminals corresponding to the respective pixels are provided; an insulation layer provided on the substrate such that at least the feed terminals are free of the insulation layer; a plurality of pixel electrodes corresponding to the respective pixels, each of the pixel electrodes being provided continuously on a corresponding one of the feed terminals and the insulation layer; a common electrode common to the pixels and provided continuously above the pixel electrodes; and a plurality of light-emitting layers corresponding to the respective pixels and provided between the pixel electrodes and the common electrode, wherein in plan view, within each of the pixels, the light-emitting layer and the feed terminal do not overlap, feed terminals of each column of pixels are provided in a column, and the common electrode is electrically connected to conductive layers, the conductive layers each having a shape of a line that overlaps a corresponding one of the columns of feed terminals.

Advantageous Effects of Invention

In the display panel and the display device according to one aspect of the present invention, the feed terminals of each column of pixels are provided in a column, and the conductive layers which are electrically connected to the common electrode are formed in lines so as to partially overlap the columns of feed terminals. Accordingly, the conductive layers do not become a hindrance to improvement of the aperture ratio, unlike a conductive layer in a conventional structure. This makes it possible to realize a high aperture ratio. In other words, since the region in which the feed terminals are provided is originally a non-light-emitting region, the conductive layers may be provided in a manner that overlaps the non-light-emitting region. In this way, an increase in the area of the non-light-emitting region due to the conductive layer can be prevented, and the area of the light-emitting region is increased as a result of the decrease in the non-light-emitting region. This makes it possible to realize a high aperture ratio. When the aperture ratio is improved, more pixels can be arranged in the same area, provided that the pixels have the same size before and after the improvement. This allows the display panel to have high resolution.

BRIEF DESCRIPTION OF DRAWINGS

FIG. 2 is a plan view showing a display panel according to Embodiment 1.

FIGS. 3A to 3C are cross-sectional views each showing the display panel according to Embodiment 1, where FIG. 3A is a cross-sectional view taken along the line A-A in FIG. 2, FIG. 3B is a cross-sectional view taken along the line B-B in FIG. 2, and FIG. 3C is a cross-sectional view taken along the line C-C in FIG. 2.

FIGS. 5A and 5B are cross-sectional views for explaining that the conductive layer according to Embodiment 1 protects pixels, where FIG. 5A shows a case where the conductive layer is formed, and FIG. 5B shows a case where the conductive layer is not formed.

FIGS. 6A and 6B are cross-sectional views each showing a display panel according to Modification 1 of Embodiment 1, where FIG. 6A is a cross-sectional view taken along the line A-A in FIG. 2, and FIG. 6B is a cross-sectional view taken along the line B-B in FIG. 2.

FIG. 7A is a cross-sectional view taken along the line A-A in FIG. 2, and FIG. 7B is a cross-sectional view taken along the line B-B in FIG. 2.

FIGS. 8A and 8B are cross-sectional views each showing a display panel according to Modification 3 of Embodiment 1, where FIG. 8A is a cross-sectional view taken along the line A-A in FIG. 2, and FIG. 8B is a cross-sectional view taken along the line B-B in FIG. 2.

FIGS. 9A and 9B are cross-sectional views each showing a display panel according to Modification 4 of Embodiment 1, where FIG. 9A is a cross-sectional view taken along the line A-A in FIG. 2, and FIG. 9B is a cross-sectional view taken along the line B-B in FIG. 2.

FIG. 10 is a plan view showing a display panel according to Embodiment 2.

Description of Embodiments

Figure 1:
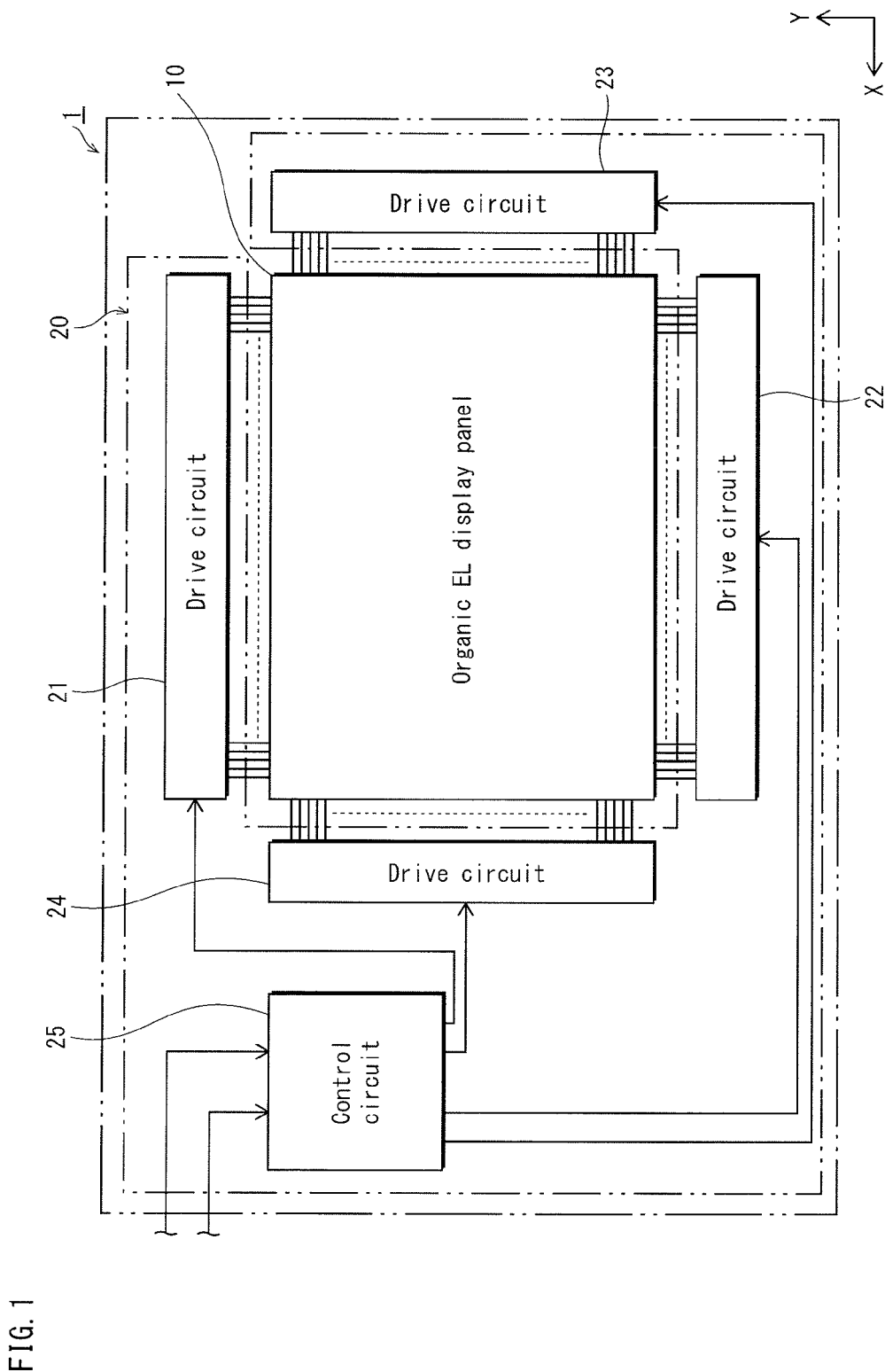
FIG. 1 shows the overall configuration of a display device according to an embodiment.

The following describes a display panel and a display device according to an embodiment of the present invention, with reference to the drawings.

Outline of an Aspect of the Present Invention

One aspect of the present invention is a display panel having a plurality of pixels arranged in rows and columns, the display panel comprising: a substrate on which a plurality of feed terminals corresponding to the respective pixels are provided; an insulation layer provided on the substrate such that at least the feed terminals are free of the insulation layer; a plurality of pixel electrodes corresponding to the respective pixels, each of the pixel electrodes being provided continuously on a corresponding one of the feed terminals and the insulation layer; a common electrode common to the pixels and provided continuously above the pixel electrodes; and a plurality of light-emitting layers corresponding to the respective pixels and provided between the pixel electrodes and the common electrode, wherein in plan view, within each of the pixels, the light-emitting layer and the feed terminal do not overlap, feed terminals of each column of pixels are provided in a column, and the common electrode is electrically connected to conductive layers, the conductive layers each having a shape of a line that overlaps a corresponding one of the columns of feed terminals.

In the display panel according to the above aspect of the present invention, the insulation layer may have a plurality of openings, the openings each having a shape of a line that overlaps a corresponding one of the columns of feed terminals, the openings may allow the feed terminals to be free of the insulation layer, and at least a bottom portion of each of the conductive layers may fit within a corresponding one of the openings.

In the display panel according to the above aspect of the present invention, in plan view, in at least one pair of adjacent columns of pixels from among the columns of pixels, feed terminals of pixels that are adjacent to each other row-wise may face each other.

In the display panel according to the above aspect of the present invention, the conductive layers may be formed over the common electrode.

In the display panel according to the above aspect of the present invention, a value obtained by dividing a volume resistivity of a conductive material of the conductive layers by a thickness of each of the conductive layers may be smaller than a value obtained by dividing a volume resistivity of a conductive material of the common electrode by a thickness of the common electrode. According to the present invention, it suffices for the resistance of the conductive layers as wiring to be smaller than the resistance of the common electrode as wiring. That is, the volume resistivity of the conductive material of the conductive layers may be larger than the volume resistivity of the conductive material of the common electrode. Suppose that the conductive layers are made of a conductive material having a larger volume resistivity than the conductivity material of the common electrode. Even in such a case, the advantageous effect of the present invention can still be obtained by increasing the thickness of the conductive layers to reduce the resistance of the conductive layers as wiring.

In the display panel according to the above aspect of the present invention, the conductive layers may be layers formed by an application method.

In the display panel according to the above aspect of the present invention, each of the conductive layers may be continuous and completely overlap the feed terminals belonging to the corresponding column.

In the display panel according to the above aspect of the present invention, a top portion of each of the conductive layers may protrude higher than a top surface of the common electrode.

In the display panel according to the above aspect of the present invention, a top surface of each of the conductive layers may be flush with a top surface of the common electrode.

Another aspect of the present invention is a display panel having a plurality of pixels arranged in rows and columns, the display panel comprising: a substrate on which a plurality of feed terminals corresponding to the respective pixels are provided; an insulation layer provided on the substrate such that at least the feed terminals are free of the insulation layer; a plurality of pixel electrodes corresponding to the respective pixels, each of the pixel electrodes being provided continuously on a corresponding one of the feed terminals and the insulation layer; a common electrode common to the pixels and provided continuously above the pixel electrodes; and a plurality of light-emitting layers corresponding to the respective pixels and provided between the pixel electrodes and the common electrode, wherein in plan view, within each of the pixels, the light-emitting layer and the feed terminal do not overlap, feed terminals of each column of pixels are provided in a column, and a portion of a top surface of the common electrode overlapping the columns of feed terminals is positioned higher than another portion of the top surface of the common electrode corresponding to the light-emitting layers.

One aspect of the present invention is a display device including any one of the display panels described above.

Description of Embodiments

The following describes an embodiment of a display panel and a display device according to the present invention, with reference to the drawings. Note that members in the accompanying figures are not depicted to scale.

[Display Device]

FIG. 1 shows the overall configuration of a display device according to an embodiment. A display device 1 according to the present embodiment is used in a display, a television, a mobile telephone, etc., for example. The display device 1 includes a display panel 10 and a drive control unit 20. The display panel 10 includes a plurality of pixels, which are formed with organic light-emitting elements that use the phenomenon of electroluminescence occurring in an organic material. The drive control unit 20 is connected to the display panel 10, and controls driving of the organic light-emitting elements. The drive control unit 20 includes, for example, four drive circuits 21-24, and a control circuit 25.

According to the present embodiment, the display panel 10 is an organic EL display panel. However, the display panel 10 may be an inorganic EL display panel with inorganic light-emitting elements that use the phenomenon of electroluminescence of an inorganic material.

[Display Panel]

Embodiment 1

The following describes a display panel according to Embodiment 1.
(Overall Configuration)

FIG. 2 is a plan view showing a display panel 10 according to Embodiment 1. As shown in FIG. 2, the display panel 10 includes a plurality of pixels 11 arranged in a matrix, i.e., in rows (in X-axis direction) and columns (Y-axis direction) in plan view. Each of the pixels 11 emits one of the luminescent colors red (R), green (G), and blue (B).

FIGS. 3A to 3C are cross-sectional views each showing the display panel 10 according to Embodiment 1. FIG. 3A is a cross-sectional view taken along the line A-A in FIG. 2. FIG. 3B is a cross-sectional view taken along the line B-B in FIG. 2. FIG. 3C is a cross-sectional view taken along the line C-C in FIG. 2. As shown in FIGS. 3A to 3C, the display panel 10 includes a substrate 101, an insulation layer 102, a pixel electrode 103, a light-emitting layer 104, a bank 105, a common electrode 106, and a conductive layer 107.
(Substrate)

The substrate 101 is, for example, a TFT substrate including a plate made of an insulation material and a plurality of TFT elements formed on the plate. The TFT elements are provided to drive the display panel 10 in an active matrix method. On the top surface of the substrate 101, a feed terminal 101a is formed for each of the pixels 11. The feed terminal 101a is provided to electrically connect the TFT elements and the pixel electrode 103. In other words, the feed terminals 101a are arranged in rows and columns on the top surface of the substrate 101, similarly to the pixels 11, and the feed terminals 101a of each column of pixels 11 are arranged in a column.

Examples of the insulation material for the plate of the substrate 101 include non-alkali glass, soda glass, nonfluorescent glass, phosphate glass, borate glass, quartz, acrylic resin, styrenic resin, polycarbonate resin, epoxy resin, polyethylene, polyester, silicone resin, and alumina.

The TFT elements of the substrate 101 are formed with silicon, an oxide semiconductor such as indium-gallium-zinc oxide, an organic semiconductor such as a pentacene, or the like, as a channel material.
(Insulation Layer)

The insulation layer 102 ensures the insulation properties of the TFT elements on the substrate 101, and planarizes the irregularities, caused by the TFT elements, etc., at the top surface of the substrate 101. The insulation layer 102 is made of an insulation material such as polyimide resin or acrylic resin. The insulation layer 102 has a plurality of openings 102a that each have a shape of a line extending column-wise, and the openings 102a overlap the respective columns of the feed terminals 101a of the substrate 101. The openings 102a allow the feed terminals 101a to be free of the insulation layer 102. In other words, the feed terminals 101a are not covered by the insulation layer 102 due to the openings 102a. In each of the openings 102a, the feed terminal 101a is in contact with the pixel electrode 103 so as to be electrically connected to the pixel electrode 103. In other words, each of the openings 102a functions as a contact window at the region corresponding to one of the feed terminals 101a. Note that the feed terminals 101a do not need to be entirely free of the insulation layer 102, and may be partially covered with the insulation layer 102 as long as the feed terminals 101a are electrically connectable to the pixel electrode 103.

The openings 102a are formed as continuous lines extending substantially from one end of the display panel 10 to another column-wise, i.e., continuous lines extending substantially across the entire display panel 10 column-wise. Each of the openings 102a is formed such that the feed terminals 101a in the pixels belonging to the same column are not covered with the insulation layer 102. Each of the openings 102a is not necessarily continuous, and may be discontinuous at one or more portions. Also, the openings 102a are not necessarily formed substantially across the entire display panel 10 column-wise. Also, the openings 102a may not reach an end of the display panel 10. Furthermore, the openings 102a do not necessarily have a constant depth.
(Pixel Electrode)

The pixel electrode 103 is formed for each pixel 11, and is made of a conductive material. The pixel electrode 103 is provided to apply an electric field to the light-emitting layer 104. Specifically, the pixel electrode 103 is formed to have a rectangular shape elongated row-wise so as to conform with the shape of the pixel 11 in plan view and to be continuous over the feed terminal 101a and the insulation layer 102. The pixel electrode 103 is electrically connected to the feed terminal 101a at a portion formed on the feed terminal 101a.

Examples of the conductive material used to form the pixel electrode 103 include a simple metal such as Ag (silver) or Al (aluminum), and an alloy such as APC (alloy of silver, palladium, and copper), ARA (alloy of silver, rubidium, and gold), MoCr (alloy of molybdenum and chromium), or NiCr (alloy of nickel and chromium).
(Light-Emitting Layer)

The light-emitting layer 104 emits light of a desired color through recombination of carriers (i.e., holes and electrons). In plan view, the light-emitting layer 104 is formed, for each pixel, in a region that is between the pixel electrode 103 and the common electrode 106, and that differs from a region in which the feed terminal 101a is arranged. Specifically, the light-emitting layer 104 is formed on a portion of the pixel electrode 103 which corresponds to the insulation layer 102.

The organic light-emitting layer 104 is formed, for example, from a polyparaphenylene vinylene (PPV), polyfluorene, a fluorescent material disclosed in Japanese Patent Application Publication No. H5-163488 such as an oxinoid compound, a perylene compound, a coumarin compound, an azacoumarin compound, an oxazole compound, an oxadiazole compound, a perinone compound, a pyrrolo-pyrrole compound, a naphthalene compound, an anthracene compound, a fluorene compound, a fluoranthene compound, a tetracene compound, a pyrene compound, a coronene compound, a quinolone compound and an azaquinolone compound, a pyrazoline derivative and a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylene pyran compound, a dicyanomethylene thiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of a 8-hydroxyquinoline compound, a metal complex of a 2-bipyridine compound, a complex of a Schiff base and a group three metal, a metal complex of an oxine, and a rare earth metal complex.

(Bank)

The bank 105 has a lattice shape in plan view, and surrounds the light-emitting layer 104. The bank 105 has an aperture 105a at a portion corresponding to the light-emitting layer 104. The light-emitting layer 104 is formed within the aperture 105a. The bank 105 has a groove 105b at a portion corresponding to the opening 102a of the insulation layer 102. In plan view, the groove 105b of the bank 105 substantially overlaps the opening 102a of the insulation layer 102. Also, the groove 105b of the bank 105 is fit into the opening 102a of the insulation layer 102.

The bank 105 is made of an insulating organic material (e.g., acrylic resin, polyimide resin, novolac phenolic resin, etc.) or an inorganic material (e.g., $SiO_2$ and SiON).

(Common Electrode)

The common electrode 106, which is common to all the pixel electrodes 103, is continuously formed above the top surfaces of all the pixel electrodes 103. The common electrode 106 is made of a translucent conductive material, and covers the light-emitting layers 104 and the bank 105 with a substantially equal thickness. Due to the substantially equal thickness, a groove 106a is formed in the common electrode 106 in a region corresponding to the groove 105b of the bank 105.

The common electrode 106 is formed with a conductive material such as ITO or IZO. Since the display panel 10 according to the present embodiment is a top-emission type, the common electrode 106 is formed with a translucent conductive material.

(Conductive Layer)

The conductive layer 107 prevents a voltage drop in the common electrode 106. The conductive layer 107 is formed on the common electrode 106, is made of a conductive material, and is electrically connected to the common electrode 106. A value obtained by dividing the volume resistivity of the conductive material of the conductive layer 107 by the thickness of the conductive layer 107 is smaller than a value obtained by dividing the volume resistivity of the conductive material of the common electrode 106 by the thickness of the common electrode 106. Accordingly, a voltage drop in the common electrode 106 is mitigated.

According to the present embodiment, it suffices for the resistance of the conductive layer 107 as wiring to be smaller than the resistance of the common electrode 106 as wiring. That is, the volume resistivity of the conductive material of the conductive layer 107 may be larger than the volume resistivity of the conductive material of the common electrode 106. Suppose that the conductive layer 107 is made of a conductive material having a larger volume resistivity than the conductivity material of the common electrode 106. Even in such a case, the advantageous effect of the present embodiment can still be obtained by increasing the thickness of the conductive layer 107 to reduce the resistance of the conductive layer 107 as wiring.

Examples of the conductive material of the conductive layer 107 include a metal such as Ag, Al, or Cu (cupper), an alloy such as APC, ARA, MoCr, or NiCr, and a metal oxide such as ITO or IZO.

As shown in FIG. 2, in plan view, the conductive layer 107 overlaps the feed terminals 101a of the pixels belonging to the same column. The conductive layer 107 is formed as a continuous line extending substantially from one end of the display panel 10 to another column-wise, i.e., a continuous line extending substantially across the entire display panel 10 column-wise.

Owing to the shape of a line overlapping the column of the feed terminals 101a, the conductive layer 107 does not become a hindrance to the improvement of the aperture ratio, unlike a conductive layer in a conventional structure. This makes it possible to realize a high aperture ratio. When the aperture ratio is improved, more pixels can be arranged in the same area, provided that the pixels have the same size before and after the improvement. This allows the display panel to have high resolution. On the other hand, provided that the number of pixels is the same before and after the improvement, the size of each pixel can be increased. This improves the luminance of the pixels, thus allowing for improvement of the lifetime of the display panel 10 and for saving of electric power.

Note that the conductive layer 107 is not necessarily continuous, and may be discontinuous at one or more portions. Also, the conductive layer 107 is not necessarily formed across the entire display panel 10 column-wise, and may not reach an end of the display panel 10. Furthermore, the conductive layer 107 does not need to have a constant thickness.

In a conventional display panel, a conductive layer is typically formed at the same time as when a pixel electrode is formed by patterning. In this case, however, the pixel electrode and the conductive layer will have the same thickness. On the other hand, according to the present embodiment, the conductive layer 107 and the pixel electrode 103 are formed at different timings. This allows the pixel electrode 103 to have a different thickness from the conductive layer 107.

Since the thickness of the conductive layer 107 does not affect the thickness of the pixel electrode 103, the conductive layer 107 can be formed to have a thickness that sufficiently meets wiring resistance specifications, which are specifications required for a reduction in resistance. In particular, when the conductive layer 107 is formed such that a bottom portion 107a thereof fits within the opening 102a, the thickness of the conductive layer 107 can be increased by the depth of the opening 102a.

Furthermore, forming the conductive layer 107 and the pixel electrode 103 at different timings means that the conductive layer 107 and the pixel electrode 103 can be formed with different materials. Accordingly, the conductive layer 107 can be formed with a material having a low volume resistivity that sufficiently meets the wiring resistance specifications, without consideration of the material of the pixel electrode 103. Since materials having a low volume resistivity are generally low in cost, the display panel 10 can be formed at low cost.

The conductive layer 107 according to the present embodiment is formed along the opening 102a of the insulation layer 102, and the bottom portion 107a of the conductive layer 107 fits within the opening 102a. The depth of the opening 102a is substantially equal to the thickness of the insulation layer 102. For example, when the thickness of the insulation layer 102 is 4 μm, the depth of the opening 102a is approximately 4 μm. Accordingly, the thickness of the conductive layer 107 is approximately 4 μm as well. Provided that a conventional conductive layer has the same thickness of 0.2 μm as a pixel electrode, then the difference in thickness between the conductive layer 107 and the conventional conductive layer is significant. If the thickness of the conductive layer 107 is significantly large, the conductive layer 107 exhibits significantly low wiring resistance, and thereby the wiring resistance specifications can be sufficiently met.

The recent trend toward large display panels has caused a problem in that a thickness currently used for a conductive layer is not sufficient to meet the wiring resistance specifications. With such a thickness, a conductive layer cannot mitigate a voltage drop in a common electrode. With the structure according to the present embodiment, however, the thickness of the conductive layer 107 can be made significantly large as compared to the conventional structure. This structure is therefore highly useful in addressing the aforementioned problem.

Also, as described above, each of the pixel electrode 103 and the conductive layer 107 can be formed to have a different thickness. This means that the thickness of the pixel electrode 103 does not affect the thickness of the conductive layer 107, either. Accordingly, the pixel electrode 103 can be thinly formed without consideration of the wiring resistance specifications of the conductive layer 107. It is desirable that thinning of the pixel electrode 103 is performed in a thickness range that does not cause a decrease in reflectivity, which is greater than or equal to 30 nm.

Note that the bank 105 according to the present embodiment is a pixel bank. However, in the case of a line bank, reducing the thickness of the pixel electrode can prevent a layer formed on the pixel electrode through a printing process from being cut off by an edge of the pixel electrode. This suppresses electrical shorting between the pixel electrode and the common electrode.

Figure 4:
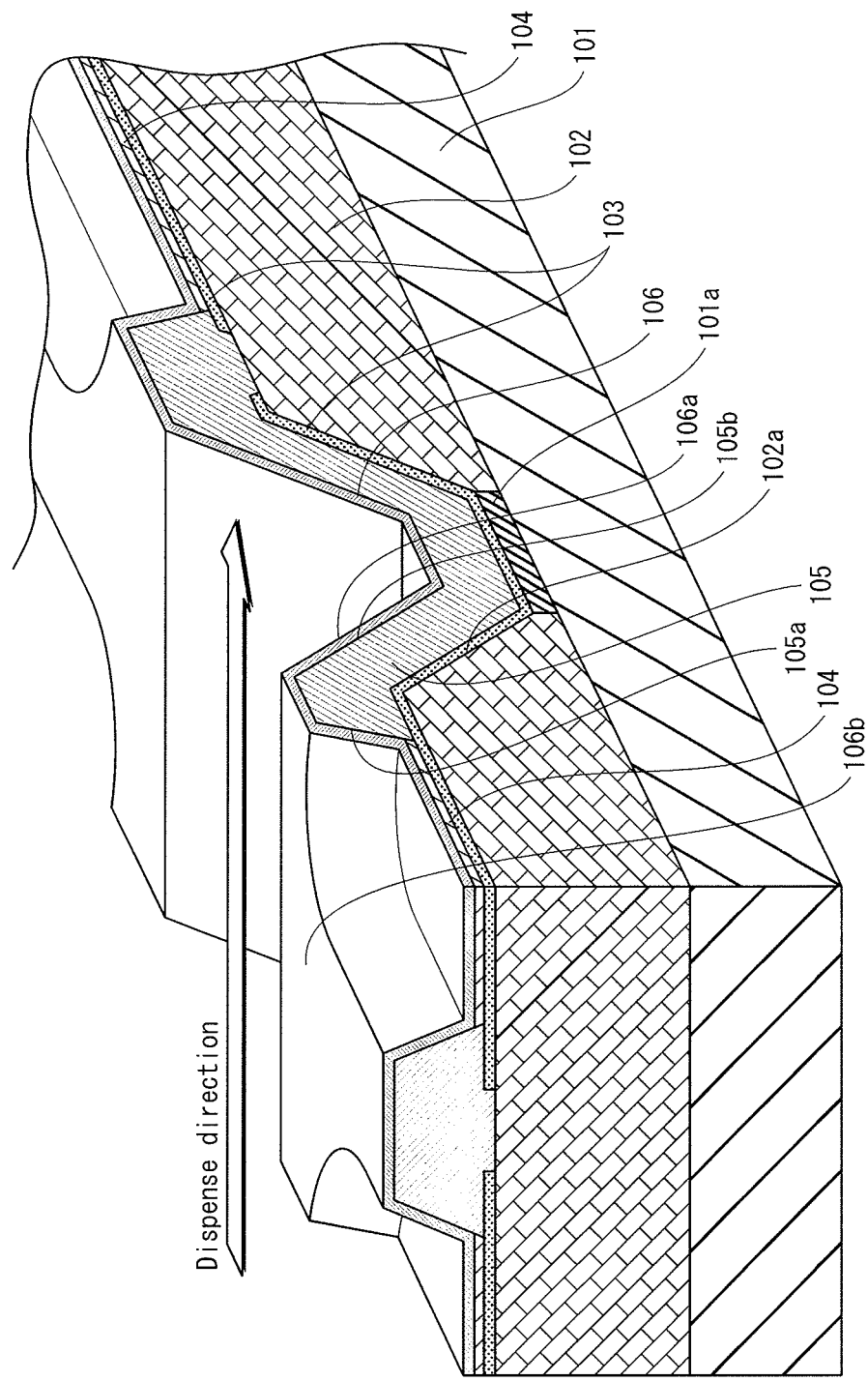
FIG. 4 is a perspective view for explaining a formation method of a conductive layer according to Embodiment 1.

FIG. 4 is a perspective view for explaining a formation method of the conductive layer according to Embodiment 1. As shown by the arrow in FIG. 4, the conductive layer 107 is formed inside and above the groove 106a of the common electrode 106, as well as in the vicinity of the groove 106a, with use of an application method. Specifically, for example, a dispenser is used to apply a paste made of silver, etc., along the groove 106a of the common electrode 106. Such an application method can be implemented at low cost, and is suitable for formation of the conductive layer 107 which is thick. In particular, with the groove 106a being formed, the conductive layer 107 can be formed to have a large thickness with a high degree of precision. The conductive layer 107 may be formed by another method, such as dye coating or inkjet printing. The method for forming the conductive layer 107 may be a method other than an application method, such as photolithography, transfer using a laser, or deposition using a metal mask.

According to the present embodiment, the conductive layer 107 is formed on the common electrode 106. Accordingly, even if paste is applied on the common electrode 106 to form the conductive layer 107, and a solvent component or the like in the paste is volatilized, the volatilized solvent does not accumulate below the common electrode 106. Also, since the common electrode 106 and the conductive layer 107 are in contact with each other to be electrically connected, loss due to a contact resistance is reduced.

FIGS. 5A and 5B are cross-sectional views for explaining that the conductive layer according to Embodiment 1 protects pixels. Specifically, FIG. 5A shows a case where the conductive layer is formed, and FIG. 5B shows a case where the conductive layer is not formed.

In the structure shown in FIG. 5A, a color filter (CF) panel 120 is formed above the conductive layer 107 with a gap 130, and a top portion 107b of the conductive layer 107 is not in contact with the CF panel 120. In this structure, if a load is applied from above the CF panel 120 or if the display panel 10 is bent, the CF panel 120 approaches the pixels 11 (a top surface 106b of the common electrode 106, to be more specific), and may damage the pixels 11. Even if the gap 130 is to be filled with resin, the CF panel 120 may approach the pixels 11 until the gap 130 is completely filled with the resin.

In the display panel 10 according to the present embodiment, however, the top portion 107b of the conductive layer 107 protrudes higher than the top surface 106b of the common electrode 106. In this way, the conductive layer 107 serves as a spacer, and the CF panel 120 stops approaching the pixels 11 by hitting the top portion 107b of the conductive layer 107. As a result, the pixels 11 are unlikely to be damaged.

On the other hand, in a display panel without a conductive layer as shown in FIG. 5B, if a load is applied from above the CF panel 120 or if the display panel 10 is bent, the CF panel 120 may hit and damage the pixels 11.

Modification of Embodiment 1

The following describes modifications of the display panel 10 according to Embodiment 1. Note that the same components as in Embodiment 1 are provided with the same reference signs in Embodiment 1.

Modification 1

In the display panel 10 according to Embodiment 1, the conductive layer 107 is formed on the common electrode 106. However, in a display panel according to the present invention, a conductive layer is not necessarily formed on a common electrode. As long as the conductive layer is formed to have the shape of a line that overlaps a column of feed terminals in plan view, the conductive layer may be formed on a layer other than the common electrode.

FIGS. 6A and 6B are cross-sectional views each showing a display panel according to Modification 1 of Embodiment 1. Specifically, FIG. 6A is a cross-sectional view taken along the line A-A in FIG. 2, and FIG. 6B is a cross-sectional view taken along the line B-B in FIG. 2. For example, as shown in FIGS. 6A and 6B, a conductive layer 207 may be formed under a common electrode 206. The conductive layer 207 is formed such that a bottom portion 207a thereof fits within the groove 105b of the bank 105. In this case as well, the conductive layer 207 and the common electrode 206 are in contact with each other to be electrically connected. Accordingly, loss due to a contact resistance is reduced, and a voltage drop is suppressed.

In addition, when the light-emitting layer 104 is formed through a printing process, the conductive layer 207 can also be formed by an application method using a dispenser. This reduces the load resulting from a process for forming the conductive layer 207.

Modification 2

In the display panel 10 according to Embodiment 1, the top portion 107b of the conductive layer 107 protrudes higher than the top surface 106b of the common electrode 106. However, a display panel according to the present invention is not limited to such.

Figure 7A:
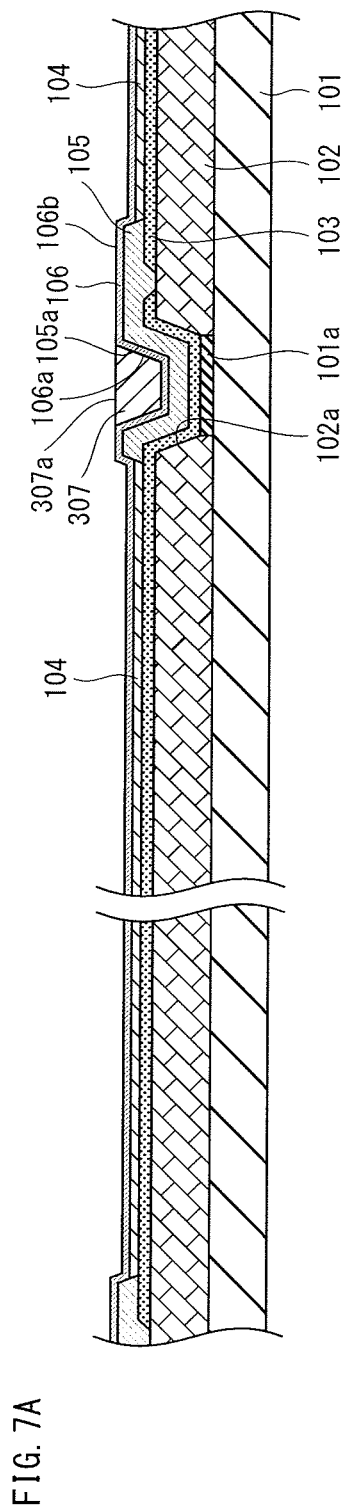
FIGS. 7A and 7B are cross-sectional views each showing a display panel according to Modification 2 of Embodiment 1, where
Figure 7B:
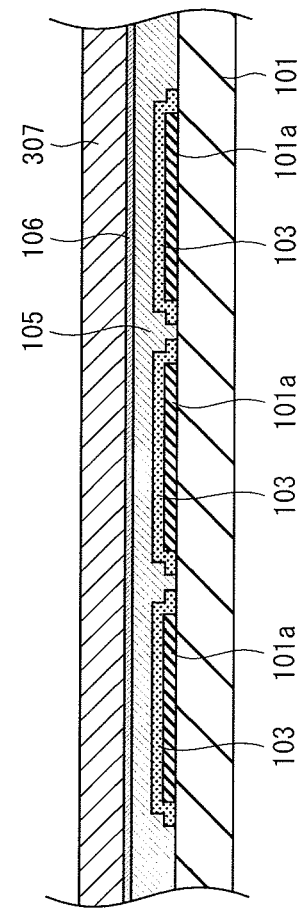

FIGS. 7A and 7B are cross-sectional views each showing a display panel according to Modification 2 of Embodiment 1. Specifically, FIG. 7A is a cross-sectional view taken along the line A-A in FIG. 2, and FIG. 7B is a cross-sectional view taken along the line B-B in FIG. 2. For example, as shown in FIGS. 7A and 7B, a top surface 307a of a conductive layer 307 may be flush with the top surface 106b of the common electrode 106. The conductive layer 307 entirely fits within the groove 106a of the common electrode 106. With this structure, since the top surface 307a of the conductive layer 307 is flush with the top surface 106b the common electrode 106, a sealing layer 130 or the like can be evenly formed on these top surfaces 307a and 106a.

Modification 3

In the display panel 10 according to Embodiment 1, the conductive layer 107 and the common electrode 106 are separate components that are each made of a different material. However, a display panel according to the present invention is not limited to such, and part of a common electrode can be thick so that the part of the common electrode serves as a conductive layer.

FIGS. 8A and 8B are cross-sectional views each showing a display panel according to Modification 3 of Embodiment 1. Specifically, FIG. 8A is a cross-sectional view taken along the line A-A in FIG. 2, and FIG. 8B is a cross-sectional view taken along the line B-B in FIG. 2. For example, as shown in FIGS. 8A and 8B, a common electrode 406 includes: a thick portion 406a that overlaps a column of feed terminals 101a; and a thin portion 406b corresponding to the light-emitting layers 104. The thick portion 406a is thicker than the thin portion 406b. Accordingly, concerning a height at the top surface of the common electrode 406 (height from the bottom surface to the top surface of the common electrode 406 in a direction vertical to the top surface of the substrate 101), a portion of the top surface of the common electrode 406 overlapping the columns of feed terminals 101a is positioned higher than another portion of the top surface of the common electrode 406 corresponding to the light-emitting layers 104. The thick portion 406a and the thin portion 406b are made of the same conductive material. Also, the thick portion 406a almost entirely fits within the groove 105b of the bank 105. On the bank 105, the top surface of the thick portion 406a is flush with the top surface of the thin portion 406b. Even with this structure, a voltage drop at the common electrode 406 is suppressed, and the thick portion 406a does not become a hindrance to the improvement of the aperture ratio; therefore, it is possible to achieve a high aperture ratio.

Modification 4

In the display panel 10 according to Embodiment 1, the bottom portion 107a of the conductive layer 107 fits within the opening 102a of the insulation layer 102. However, a display panel according to the present invention is not limited to such.

FIGS. 9A and 9B are cross-sectional views each showing a display panel according to Modification 4 of Embodiment 1. Specifically, FIG. 9A is a cross-sectional view taken along the line A-A in FIG. 2, and FIG. 9B is a cross-sectional view taken along the line B-B in FIG. 2. For example, as shown in FIGS. 9A and 9B, the display panel may include an insulation layer 502 in which no linear openings are formed, and a contact window 502a may be formed in an area corresponding to the feed terminal 101a. In this case, the contact window 502a ensures an electrical connection between the feed terminal 101a and the pixel electrode 103.

No grooves are formed in a bank 505, and the top surface of the bank 505 is flat. Accordingly, part of the top surface of a common electrode 506, which corresponds to the bank 505, is also flat. On the part of the top surface, a conductive layer 507 is formed. The conductive layer 507 can be formed with a dispenser as long as the viscosity of paste is adjusted appropriately.

Embodiment 2

In the display panel 10 according to Embodiment 1, the position of the feed terminal 101a with respect to the light-emitting layer 104 is the same in each pixel in plan view. However, the position of the feed terminal 101a with respect to the light-emitting layer 104 in each pixel does not need to be the same.

Figure 11:
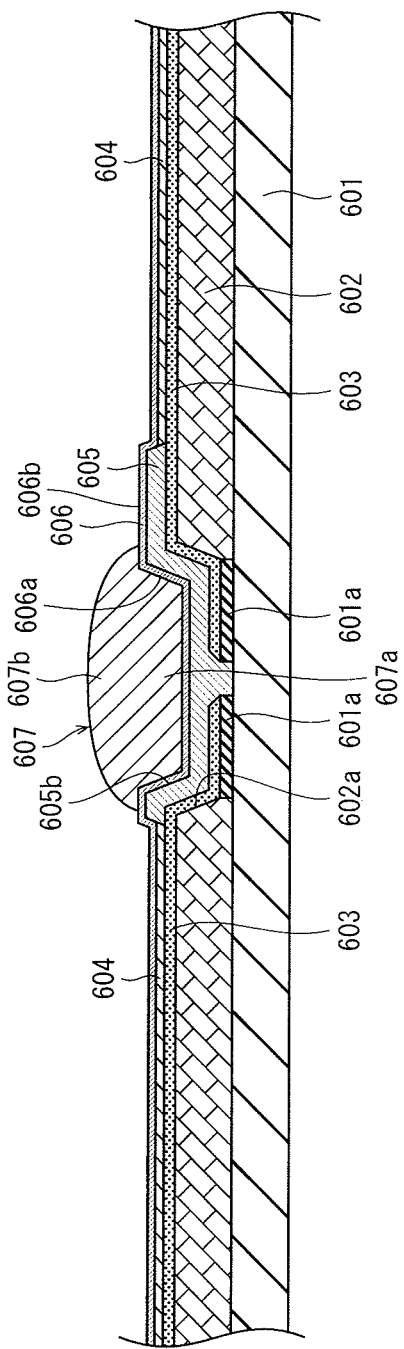
FIG. 11 is a cross-sectional view showing the display panel according to Embodiment 2, taken along the line D-D in FIG. 10.
Figure 12:
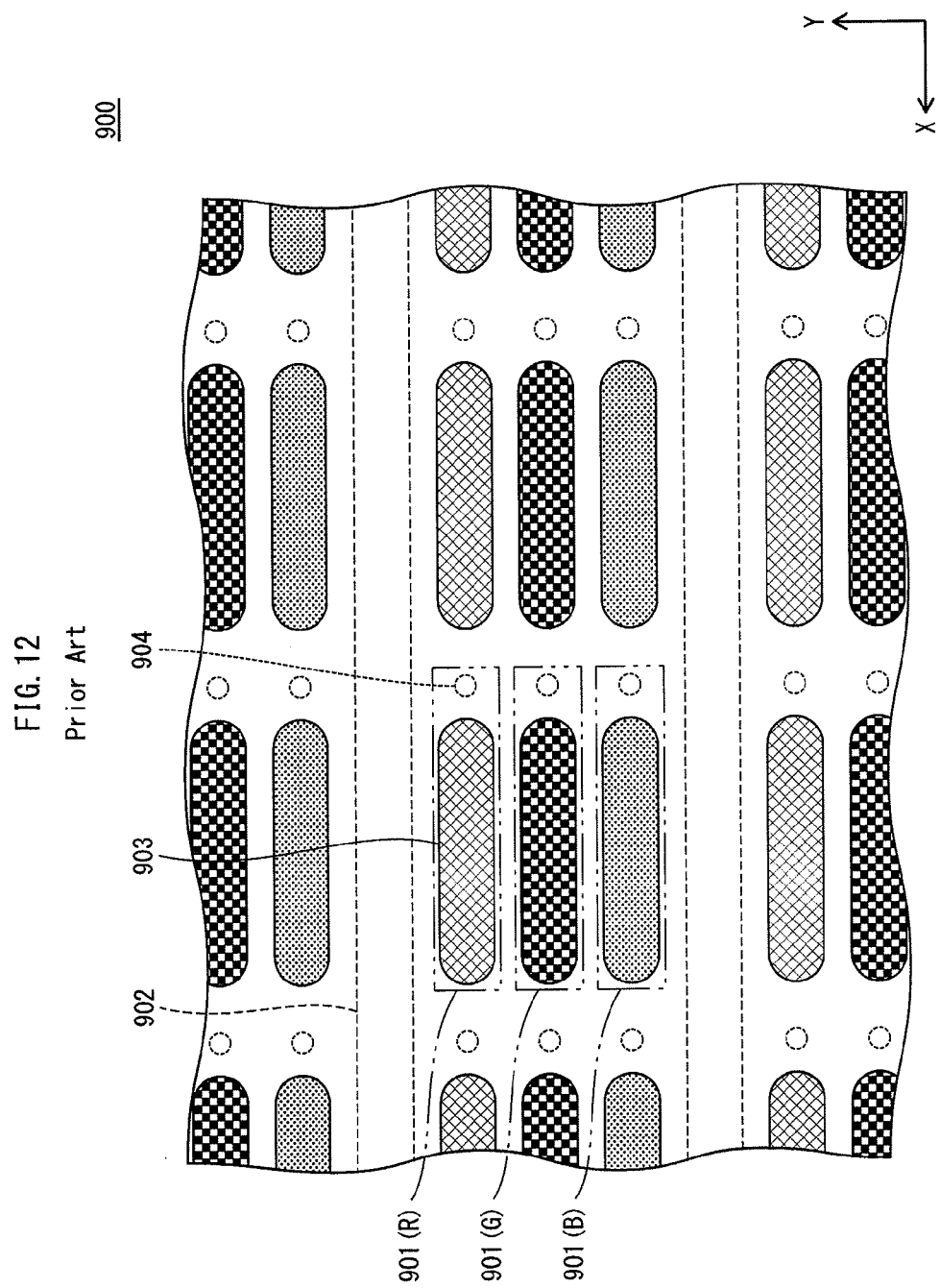
FIG. 12 is a plan view showing a conventional display panel.

FIG. 10 is a plan view showing a display panel according to Embodiment 2. FIG. 11 is a cross-sectional view showing a display panel according to Embodiment 2, taken along the line D-D in FIG. 10. As shown in FIG. 10, when a display panel 600 according to Embodiment 2 is seen in plan view, in at least one pair of adjacent columns of pixels 611 from among a plurality of pixels 611 corresponding to luminescent colors R, G, and B, feed terminals 601a of pixels 611 that are adjacent to each other row-wise face each other. Such two adjacent columns of pixels 611 are repeatedly arranged as pairs row-wise. In each pair of adjacent columns of pixels 611, the feed terminals 601a that face each other are sandwiched between light emitting layers 604 of the pixels 611 that are adjacent to each other row-wise.

With such a structure, a conductive layer 607 can be formed to extend over the feed terminals 601a in each adjacent pair of columns of pixels 611 row-wise in plan view. As a result, the width of the conductive layer 607 in a row-wise direction can be increased. For example, given that the width of a conventional conductive layer is 40 μm in a row-wise direction, the width of the conductive layer 607 according to the present embodiment can be set in a range of approximately 70 μm to 80 μm. As can be seen from this example, the width of the conductive layer 607 in a row-wise direction can be greatly increased as compared to the conventional conductive layer. In this way, the wiring resistance of the conductive layer 607 is decreased to sufficiently meet the wiring resistance specifications.

As shown in FIG. 11, an opening 602a of an insulation layer 602 is formed to extend over the two feed terminals 601a in a pair of adjacent pixels 611. In other words, the opening 602a allows the feed terminals 601a of the two adjacent columns of pixels 611 to be free of the insulation layer 602. A groove 605a of a bank 605 is formed to substantially overlap the opening 602a of the insulation layer 602 in plan view. Also, a groove 606a of a common electrode 606 is also formed to substantially overlap the opening 602a of the insulation layer 602.

The conductive layer 607 is formed such that a bottom portion 607a thereof fits within the groove 605a of the bank 605, and is formed to have the shape of a line so as to overlap the two columns of feed terminals 601a. Also, a top portion 607b of the conductive layer 607 protrudes higher than a top surface 606b of the common electrode 606.

With this structure, the thickness of the conductive layer 607 can be increased. For example, given that a conventional conductive layer has the same thickness of 0.2 μm as the pixel electrode 603, the thickness of the conductive layer 607 according to the present embodiment can be set to 4 μm. As can be seen from this example, the thickness of the conductive layer 607 can be greatly increased as compared to the conventional conductive layer.

The following compares the area of a cross-section of the conductive layer 607 according to the present embodiment, which is taken along a row-wise direction (i.e., cross-section as shown in FIG. 11), to the area of a cross-section of a conventional conductive layer taken along a row-wise direction. The area of the cross-section of the conductive layer 607, which has a width of 70 μm in a row-wise direction and a thickness of 4 μm, is approximately 280 μm². On the other hand, the area of the cross-section of the conventional conductive layer, which has a width of 40 μm in a row-wise direction and a thickness of 0.2 μm, is approximately 8 μm². As can be seen from the comparison result, the area of the cross-section of the conductive layer 607 according to the present embodiment is much larger than the area of the cross-section of the conventional conductive layer. A significant increase in the area of the cross-section of a conductive layer causes a significant decrease in the wiring resistance.

<Others>

While a display panel and a display device according to an aspect of the present invention have been concretely described, the above embodiments are merely examples for clearly illustrating the effects and advantages of an aspect of the present invention. The present invention is in no way limited to the above embodiments. For example, the size, shape, material, etc., of each component are merely typical examples to facilitate comprehension, and the present invention is in no way limited to these sizes, shapes, materials, etc. Also, in one aspect of the present invention, a display panel and a display device may have a structure according to a combination of Embodiment 1, Modifications 1-4 thereof, and part of Embodiment 2.

Furthermore, in the above description, a light-emitting element constitutes a pixel, and the light-emitting element includes a pixel electrode, a light-emitting layer, and a common electrode. However, other layers, such as a hole injection layer, a hole transport layer, an electron injection layer, and an electron transport layer, may be provided between the pixel electrode and the common electrode. Also, other layers may be provided under the pixel electrode or on the common electrode.

INDUSTRIAL APPLICABILITY

The display panel and the display device of the present invention are favorably applicable to: various displays in homes, public facilities, and workplaces; televisions; displays for portable electronic devices; and the like. Also, the display panel and the display device of the present invention are applicable to liquid crystal display panels and the like, as well as organic EL display panels and inorganic EL display panels.

REFERENCE SIGNS LIST 1 display device
10, 600 display panel
11, 611 pixel
101, 601 substrate
101a, 601a feed terminal
102, 602 insulation layer
102a, 602a opening
103, 603 pixel electrode
104, 604 light-emitting layer
106, 606 common electrode
106a, 606a top surface of common electrode
107, 207, 307, 507, 607 conductive layer
107b, 607b top portion of conductive layer
307a top surface of conductive layer
406a thick portion that overlaps feed terminals
406b thin portion that correspond to light-emitting layers

The invention claimed is:

1. A display panel having a plurality of pixels arranged in rows and columns, the display panel comprising:
a substrate on which a plurality of feed terminals corresponding to the respective pixels are provided;
an insulation layer provided on the substrate such that at least the feed terminals are free of the insulation layer;
a plurality of pixel electrodes corresponding to the respective pixels, each of the pixel electrodes being provided continuously on a corresponding one of the feed terminals and the insulation layer;
a common electrode common to the pixels and provided continuously above the pixel electrodes; and
a plurality of light-emitting layers corresponding to the respective pixels and provided between the pixel electrodes and the common electrode, wherein
in plan view,
within each of the pixels, the light-emitting layer and the feed terminal do not overlap,
feed ten finals of each column of pixels are provided in a column, and
the common electrode is electrically connected to conductive layers, the conductive layers each having a shape of a line that overlaps a corresponding one of the columns of feed terminals.

2. The display panel of claim 1, wherein
the insulation layer has a plurality of openings, the openings each having a shape of a line that overlaps a corresponding one of the columns of feed terminals,
the openings allow the feed terminals to be free of the insulation layer, and
at least a bottom portion of each of the conductive layers fits within a corresponding one of the openings.

3. The display panel of claim 1, wherein
in plan view,
in at least one pair of adjacent columns of pixels from among the columns of pixels, feed terminals of pixels that are adjacent to each other row-wise face each other.

4. The display panel of claim 1, wherein
the conductive layers are formed over the common electrode.

5. The display panel of claim 1, wherein
a value obtained by dividing a volume resistivity of a conductive material of the conductive layers by a thickness of each of the conductive layers is smaller than a value obtained by dividing a volume resistivity of a conductive material of the common electrode by a thickness of the common electrode.

6. The display panel of claim 1, wherein
the conductive layers are layers formed by an application method.

7. The display panel of claim 1, wherein
each of the conductive layers is continuous and completely overlaps the feed terminals belonging to the corresponding column.

8. The display panel of claim 1, wherein
a top portion of each of the conductive layers protrudes higher than a top surface of the common electrode.

9. The display panel of claim 1, wherein
a top surface of each of the conductive layers is flush with a top surface of the common electrode.

10. A display panel having a plurality of pixels arranged in rows and columns, the display panel comprising:
a substrate on which a plurality of feed terminals corresponding to the respective pixels are provided;
an insulation layer provided on the substrate such that at least the feed terminals are free of the insulation layer;
a plurality of pixel electrodes corresponding to the respective pixels, each of the pixel electrodes being provided continuously on a corresponding one of the feed terminals and the insulation layer;
a common electrode common to the pixels and provided continuously above the pixel electrodes; and
a plurality of light-emitting layers corresponding to the respective pixels and provided between the pixel electrodes and the common electrode, wherein in plan view, within each of the pixels, the light-emitting layer and the feed terminal do not overlap, feed terminals of each column of pixels are provided in a column, and a portion of a top surface of the common electrode overlapping the columns of feed terminals is positioned higher than another portion of the top surface of the common electrode corresponding to the light-emitting layers.

11. A display device including the display panel of claim 1.

\* \* \* \* \*